United States Patent
Patel et al.

(10) Patent No.: US 11,639,962 B1
(45) Date of Patent: May 2, 2023

(54) SCALABLE SCAN ARCHITECTURE FOR MULTI-CIRCUIT BLOCK ARRAYS

(71) Applicant: Xilinx, Inc., San Jose, CA (US)

(72) Inventors: Niravkumar Patel, San Jose, CA (US); Amitava Majumdar, San Jose, CA (US); Partho Tapan Chaudhuri, Nagpur (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/199,874

(22) Filed: Mar. 12, 2021

(51) Int. Cl.
| | |
|---|---|
| *G01R 31/3177* | (2006.01) |
| *G01R 31/317* | (2006.01) |
| *G01R 31/3185* | (2006.01) |
| *G01R 31/3187* | (2006.01) |
| *G06F 11/27* | (2006.01) |

(52) U.S. Cl.
CPC .......... *G01R 31/3177* (2013.01); *G01R 31/31704* (2013.01); *G01R 31/3172* (2013.01); *G01R 31/3185* (2013.01); *G01R 31/3187* (2013.01); *G01R 31/31723* (2013.01); *G01R 31/318536* (2013.01); *G01R 31/318541* (2013.01); *G01R 31/318544* (2013.01);
(Continued)

(58) Field of Classification Search
CPC ............ G01R 31/3177; G01R 31/3172; G01R 31/31723; G01R 31/3185; G01R 31/318536; G01R 31/318541; G01R 31/318544; G01R 31/318547; G01R 31/318566; G01R 31/3187; G06F 11/27
See application file for complete search history.

(56) References Cited

U.S. PATENT DOCUMENTS

| | | |
|---|---|---|
| 5,673,273 A | 9/1997 | Almy |
| 6,389,558 B1 | 5/2002 | Herrmann |
| (Continued) | | |

FOREIGN PATENT DOCUMENTS

AU 2011299256 A1 2/2013

OTHER PUBLICATIONS

Khan, H., An Intrusive Dynamic Reconfigurable Cycle-Accurate Debugging System for Embedded Processors, Apr. 2018, Springer International Publishing, Applied Reconfigurable Computing, pp. 433-445 (Year: 2018).
(Continued)

*Primary Examiner* — Cynthia Britt
*Assistant Examiner* — Sazzad Hossain
(74) *Attorney, Agent, or Firm* — Kevin T. Cuenot

(57) ABSTRACT

An integrated circuit (IC) can include a plurality of circuit blocks, wherein each circuit block includes design for testability (DFT) circuitry. The DFT circuitry can include a scan interface, wherein each scan interface is uniform with the scan interface of each other circuit block of the plurality of circuit blocks, an embedded deterministic test circuit coupled to the scan interface, wherein the embedded deterministic test circuit couples to circuitry under test, and a scan response analyzer coupled to the scan interface. The scan response analyzer is configured to operate in a selected scan response capture mode selected from a plurality of scan response capture modes. The IC can include a global scan router connected to the scan interfaces of the plurality of circuit blocks. The global scan router is configured to activate a subset of the plurality of circuit blocks in parallel for a scan test.

19 Claims, 11 Drawing Sheets

(52) U.S. Cl.
CPC ............... *G01R 31/318547* (2013.01); *G01R 31/318566* (2013.01); *G06F 11/27* (2013.01)

(56) References Cited

U.S. PATENT DOCUMENTS

| | | | |
|---|---|---|---|
| 6,944,836 B1 | 9/2005 | Lai | |
| 7,739,564 B1 | 6/2010 | Lai | |
| 7,814,444 B2 * | 10/2010 | Wohl | ...................... H03M 7/30 |
| | | | 716/100 |
| 8,063,654 B2 | 11/2011 | Rahman et al. | |
| 8,072,234 B2 | 12/2011 | Fox | |
| 8,327,201 B1 | 12/2012 | Lai | |
| 9,404,969 B1 * | 8/2016 | Keller | .............. G01R 31/31703 |
| 9,685,957 B2 | 6/2017 | How | |
| 10,816,598 B1 | 10/2020 | Merugu et al. | |
| 2002/0078412 A1 | 6/2002 | Wang et al. | |
| 2005/0060625 A1 * | 3/2005 | Wang | ............. G01R 31/318547 |
| | | | 714/727 |
| 2005/0154552 A1 | 7/2005 | Stroud et al. | |
| 2007/0234169 A1 * | 10/2007 | Rajski | .............. G01R 31/31723 |
| | | | 714/742 |
| 2012/0126846 A1 | 5/2012 | Jong et al. | |
| 2017/0328951 A1 * | 11/2017 | Liew | .................. G01R 31/3187 |
| 2020/0309851 A1 * | 10/2020 | Narayanan | ..... G01R 31/318563 |

OTHER PUBLICATIONS

Xilinx Users Guide: RTL and Technology Schematic Viewers Tutorial—UG685 (v14.1) Apr. 24, 2012, Xilinx, Inc. (Year: 2012).
Xilinx, "Integrated Logic Analyzerv 6.2," LogiCORE IP Product Guide, Vivado Design Suite, Oct. 5, 2016, pp. 1-31, Kilinx, Inc., San Jose, California, USA.

* cited by examiner

900

Provide a plurality of circuit blocks within the integrated circuit, wherein each circuit block of the plurality of circuit blocks includes design for testability circuitry, the design for testability circuitry including: a scan interface, wherein each scan interface is uniform with the scan interface of each other circuit block of the plurality of circuit blocks; an embedded deterministic test circuit coupled to the scan interface, wherein the embedded deterministic test circuit couples to circuitry under test; and, a scan response analyzer coupled to the scan interface, wherein the scan response analyzer is configured to operate in a selected response capture mode selected from a plurality of response capture modes
902

Provide a global scan router connected to the scan interfaces of the plurality of circuit blocks, wherein the global scan router is configured to activate a subset of the plurality of circuit blocks to implement parallel scan testing of the activated subset of the plurality of circuit blocks
904

Provide a plurality of circuit blocks within the integrated circuit, wherein the plurality of circuit blocks is organized into a plurality of groups, and wherein each group includes two or more of the plurality of circuit blocks and fewer than all of the plurality of circuit blocks
1002

Activate one or more circuit blocks of a selected group of the plurality of groups, wherein at least one other group of the plurality of groups is deactivated concurrently with the activating of the selected group
1004

Perform scan testing of the one or more activated circuit blocka of the selected group in parallel
1006

SCALABLE SCAN ARCHITECTURE FOR MULTI-CIRCUIT BLOCK ARRAYS

TECHNICAL FIELD

This disclosure relates to design for testability (DFT) for integrated circuits (ICs) and, more particularly, to DFT circuitry that provides a scalable scan architecture for testing an IC having an array of circuit blocks.

BACKGROUND

Design for testability (DFT) refers to design techniques that add testability features to hardware products such as integrated circuits (ICs). When included in an IC, testability features allow certain aspects of the IC to be tested. The testability features facilitate the detection of manufacturing defects in the IC that may adversely impact the IC's ability to function correctly. Scan test is an example of a DFT feature included in modern ICs where flip-flops within an IC are modified into a chain to propagate signals for testing purposes. The modified flip-flops, sometimes referred to as scan cells, form scan chains. Test data (e.g., test signals) may be fed into the IC and propagate through the scan chains allowing the circuitry to be tested by observing signals output from pins of the IC. The ever-increasing size and complexity of ICs presents new challenges for DFT.

SUMMARY

In one aspect, an integrated circuit can include a plurality of circuit blocks. Each circuit block of the plurality of circuit blocks can include design for testability circuitry. The design for testability circuitry can include a scan interface. Each scan interface is uniform with the scan interface of each other circuit block of the plurality of circuit blocks. The design for testability circuitry can include an embedded deterministic test circuit coupled to the scan interface. The embedded deterministic test circuit can couple to circuitry under test. The design for testability circuitry can include a scan response analyzer coupled to the scan interface. The scan response analyzer can be configured to operate in a selected scan response capture mode selected from a plurality of scan response capture modes. The integrated circuit also can include a global scan router connected to the scan interfaces of the plurality of circuit blocks. The global scan router is configured to activate a subset of the plurality of circuit blocks to implement parallel scan testing of the activated subset of the plurality of circuit blocks.

In another aspect, a method of testing an integrated circuit can include providing a plurality of circuit blocks within the integrated circuit, wherein the plurality of circuit blocks is organized into a plurality of groups. Each group includes two or more of the plurality of circuit blocks and fewer than all of the plurality of circuit blocks. The method can include activating one or more circuit blocks of a selected group of the plurality of groups, wherein at least one other group of the plurality of groups is deactivated concurrently with the activating of the selected group. The method also can include performing scan testing of the one or more circuit blocks of the selected group in parallel.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 9 illustrates an example method of testing an integrated circuit using the example DFT circuit architecture described herein.

FIG. 10 illustrates another example method of testing an integrated circuit using the example DFT circuit architecture described herein.

DETAILED DESCRIPTION

Figure 1:
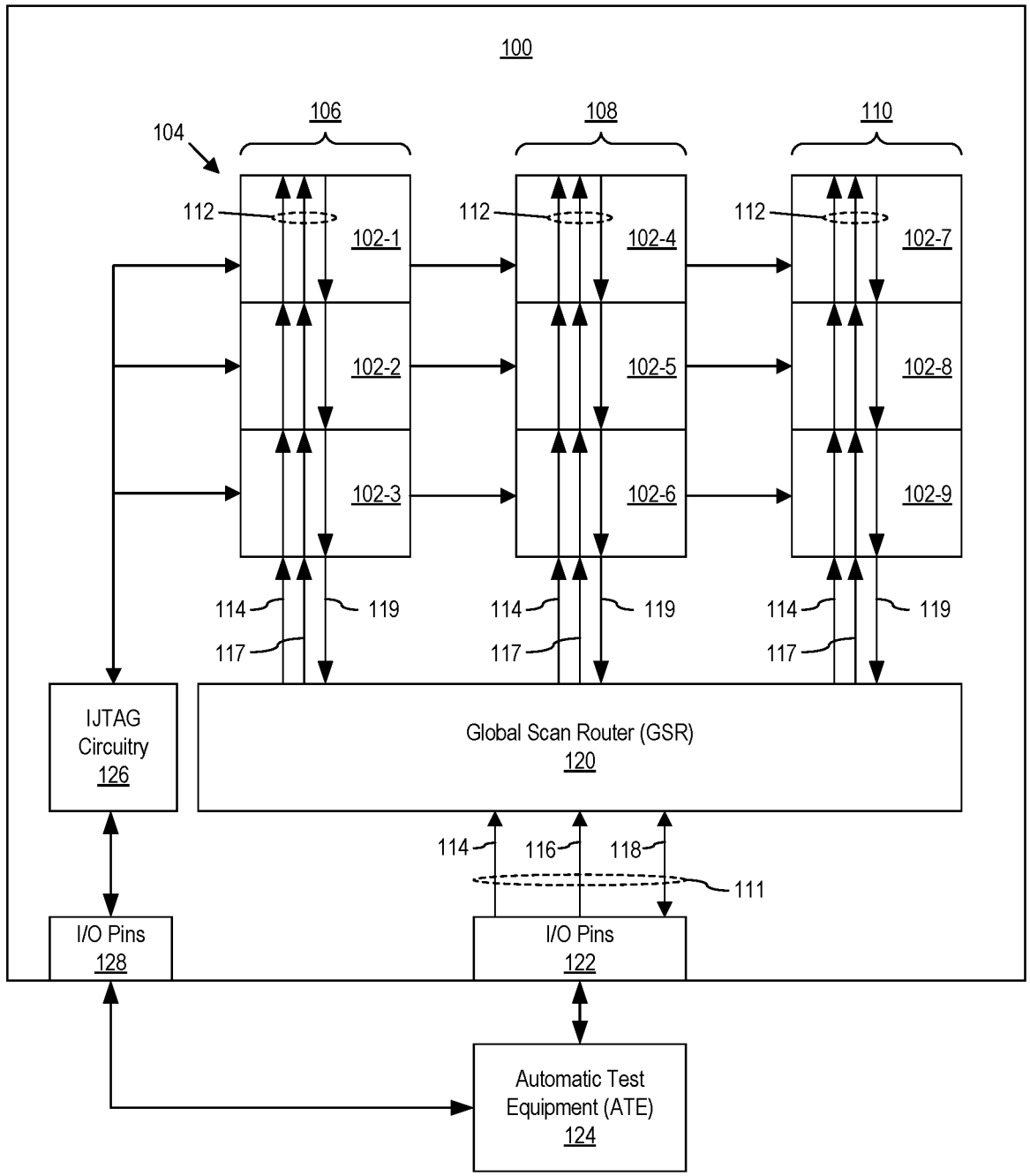
FIG. 1 illustrates an integrated circuit including an array of circuit blocks implemented using an example design for testability circuit architecture.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to design for testability (DFT) for integrated circuits (ICs) and, more particularly, to DFT circuitry that provides a scalable scan architecture for testing an IC having an array of circuit blocks. In accordance with the inventive arrangements described within this disclosure, DFT circuitry is included in an IC that provides a scalable scan channel architecture. The DFT circuitry includes various circuits, some of which are incorporated into the array of circuit blocks. The DFT circuitry may be used for testing ICs and, more particularly, the array, during wafer sort. The DFT circuitry, for example, facilitates scan testing and/or other types of testing of the array.

The DFT circuitry may be used to test an array formed of multiple instances of a circuit block. The circuit blocks of the array may be substantially similar or identical. In one aspect, the DFT circuitry utilizes a fixed scan interface between the circuit blocks of the array. The scan interface in each circuit block may be fixed in that each scan interface of a circuit block in the array has the same number of input and same number of output channels. Use of such a scan interface ensures that as the number of circuit blocks of the array changes over time with the introduction of new and/or different versions of the IC, the scan channel architecture scales with the varying size of the array. Further, the same scan interface may be used as the circuit architecture of the individual circuit blocks of the array changes from one iteration of the IC to another. As such, a new and/or different scan channel architecture need not be designed for testing circuit blocks of the array as the number of circuit blocks in the array decreases or increases and/or the architecture of the circuit blocks changes. Rather, the existing scan channel architecture may be re-used by adding and/or removing circuit blocks so long as each circuit block of the array conforms to the requirements of the fixed scan interface among the circuit blocks.

For purposes of illustration, the array may include multi-instantiated circuit blocks. The circuit blocks may be multiple instantiated copies of a "core," for example. Each core utilizes a same scan interface having a fixed number of inputs and outputs to implement the scalable scan channel architecture. As defined herein, the term "core" means a pre-designed and reusable unit of logic, cell, or chip layout design in the field of electronic circuit design. A core, sometimes referred to as an "Intellectual Property (IP) Core" or "IP," may be expressed as a data structure specifying a description of hardware that performs a particular function. For example, a core may be expressed using hardware description language file(s), as a netlist, or the like. The core may be implemented in an IC. In the case of an array, as described herein, the array may include multiple instances of the core. The core may be used as a building block within the IC. Examples of different varieties of cores include, but are not limited to, digital signal processor (DSP) circuits, memory circuits, and the like.

The DFT circuitry may include one or more other circuits. In one aspect, the DFT circuitry is capable of shifting testing data through the various circuit blocks of the array and out of the IC to an external testing system. The DFT circuitry is capable of selectively enabling different groups of the circuit blocks of the array such that selected subsets of the circuit blocks of the array may be tested in parallel. The ability to select which subsets of the circuit blocks of the array may be tested in parallel allows greater control over power consumption particularly where the available current from the testing equipment may be limited. The ability to selectively enable different groups of circuit blocks may be performed in real time during testing.

The DFT circuitry further supports multiple scan response capture modes. In one or more scan response capture modes, scan test responses may be output from the IC. In one or more other scan response capture modes, a scan test response of a given circuit block of the array may be compared with the scan test response from another circuit block of the array. Such comparisons may be performed locally within the circuit block(s) of the array. In still one or more other scan response capture modes, a signature may be generated from a scan test response of a circuit block, where the signature may be stored locally in the circuit block and compared with a reference scan test response also stored locally in the circuit block. The comparison may be performed locally within the circuit block.

Further, in one or more scan response capture modes, a test status indicator may be generated locally within the circuit blocks and stored locally within the respective circuit blocks. The test status indicator specifies whether a given scan test was passed by the circuit block. The test status indicators of the various circuit blocks of the array may be output from the IC. In the case of scan response capture modes that perform comparisons locally within the circuit blocks and/or generate test status indicators, the external testing system need not perform any comparisons to ascertain whether the IC and/or individual circuit blocks of the array therein passed a given scan test. The ability to change from one scan response capture mode to another may be performed in real time during testing.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example IC 100 including an array 104 having multiple circuit blocks 102 implemented using an example DFT circuit architecture. In one aspect, each of circuit blocks 102 of array 104 is the same or identical. In another example implementation, circuit blocks 102 are substantially the same. Circuit blocks 102 may be implemented as cores.

In the example of FIG. 1, circuit blocks 102 are arranged in groups 106, 108, and 110. Each group 106, 108, and 110 is a subset of the total circuit blocks 102 of array 104. For purposes of illustration, each group in the example of FIG. 1 is formed of a column of circuit blocks 102. In other example implementations, each group may be formed of a row of circuit blocks 102 or other arrangement of circuit blocks 102. In the example, each circuit block 102 includes a scan interface 112. Scan interface 112 is the same for each circuit block 102.

Circuit blocks 102 are coupled to a global scan router (GSR) 120. GSR 120 is coupled to Automatic Test Equipment (ATE) 124 via input/output (I/O) pins 122. GSR 120 couples to I/O pins 122 via a primary scan interface 111. Primary scan interface 111 includes a scan control channel 114, a primary scan input channel 116, and a primary scan output channel 118. In another aspect, one or more or all signals of primary scan output channel 118 may be implemented as bidirectional signals that, when not used to output data, may be configured to operate as inputs capable of receiving one or more scan mask input signals. This repurposing of signals of primary scan output channel 118 may be controlled by GSR 120.

GSR 120 is coupled to each group 106, 108, and 110 of circuit blocks 102 via scan control channel 114, scan input channel 117, and scan output channel 119. As such, scan interface 112 used by each of circuit blocks 102 includes scan control channel 114, a scan input channel 117, and a scan output channel 119. GSR 120 is capable of controlling which of groups 106, 108, and/or 110 of circuit blocks 102 is/are activated for testing at any given time. Circuit blocks 102 of each activated group may be tested in parallel (e.g., concurrently). For example, GSR 120, based on testing data loaded into IC 100 from ATE 124, is capable of activating and/or deactivating selected ones of groups 106, 108, and/or 110 for testing. Those circuit blocks 102 of an activated group may be tested in parallel while those circuit blocks 102 that are not part of an activated group are not tested.

In one aspect, GSR 120 is capable of activating any one or more of groups 106, 108, and/or 110 so that each circuit block 102 in an activated group may be tested in parallel, e.g., concurrently. As an example, as part of testing IC 100, GSR 120 may activate circuit blocks 102 of group 106 while circuit blocks 102 of groups 108 and 110 are deactivated. In that case, circuit blocks 102-1, 102-2, and 102-3 may be tested in parallel. GSR 120, as part of testing IC 100, may then activate circuit blocks 102 of group 108 while circuit blocks 102 of groups 106 and 110 are deactivated. In that case, circuit blocks 102-4, 102-5, and 102-6 may be tested in parallel. In other examples, more than two groups of circuit blocks 102 may be activated at the same time so that the circuit blocks 102 in each activated group may be tested in parallel.

The particular number of groups and/or circuit blocks that may be activated for parallel testing may vary based on power limitations of the IC and/or ATE 124. ATE 124, for example, may follow a power budget that restricts the amount of current that may be supplied to IC 100. Accordingly, the number of groups of circuit blocks 102 that are activated at any given time may be limited to a number that conforms with the power budget of ATE 124. GSR 120 is capable of activating and deactivating groups of circuit blocks 102 in real time based on the testing data that is loaded into IC 100.

IC 100 further includes Internal Joint Test Action Group (IJTAG) circuitry 126 coupled to I/O pins 128. IJTAG circuitry 126 may be implemented in accordance with IEEE P1687 standard. IJTAG circuitry 126 is capable of exchanging IJTAG signals with ATE 124 by way of I/O pins 128. IJTAG circuitry 126 also capable of exchanging IJTAG signals with each of circuit blocks 102 by way of further IJTAG signals. While GSR 120 is capable of controlling which group or groups of circuit blocks 102 are activated for purposes of parallel test, IJTAG circuitry 126 may be used to activate or deactivate particular (e.g., individual) circuit blocks 102 within an activated group of circuit blocks 102 for testing. Thus, using GSR 120 and IJTAG circuitry 126, particular individual circuit blocks 102 of array 104 may be activated concurrently for testing in parallel.

ATE 124 is capable of providing testing data (e.g., test signals) to IC 100. ATE 124 provides test data to GSR 120 by way of I/O pins 122 to test array 104. GSR 120 outputs the testing data to the respective circuit blocks 102 in the form of scan control channel 114 and scan input channel 117. GSR 120 is capable of receiving results of testing from circuit blocks 102 as scan output channel 119 and outputting such results via scan output channel 118 to I/O pins 122 and to ATE 124. In one or more other example implementations, testing data may be loaded into IC 100 via I/O pins 128 that connect to IJTAG circuitry 126. IJTAG circuitry 126 provide IJTAG signals to circuit blocks 102. Results from testing may be read by IJTAG circuitry 126 from circuit blocks 102 and provided to ATE 124 by way of I/O pins 128.

In the example of FIG. 1, features such as the number of circuit blocks 102 in array 104, the number of circuit blocks 102 in each group, the layout of array 104, and the arrangement of the groups are provided for purposes of illustration. It should be appreciated that the inventive arrangements described herein may be used with other arrays having the same or different features and/or different arrangement of circuit blocks. For example, circuit blocks 102 may be organized or clustered in groups based on the floorplan of IC 100.

Within FIG. 1, the connections illustrated correspond to the DFT circuitry. It should be appreciated that circuit blocks 102 may be interconnected using additional circuitry not shown in the example of FIG. 1. Such additional circuitry may be used during regular operation (e.g., runtime) of IC 100 and, more particularly, array 104.

Figure 2:
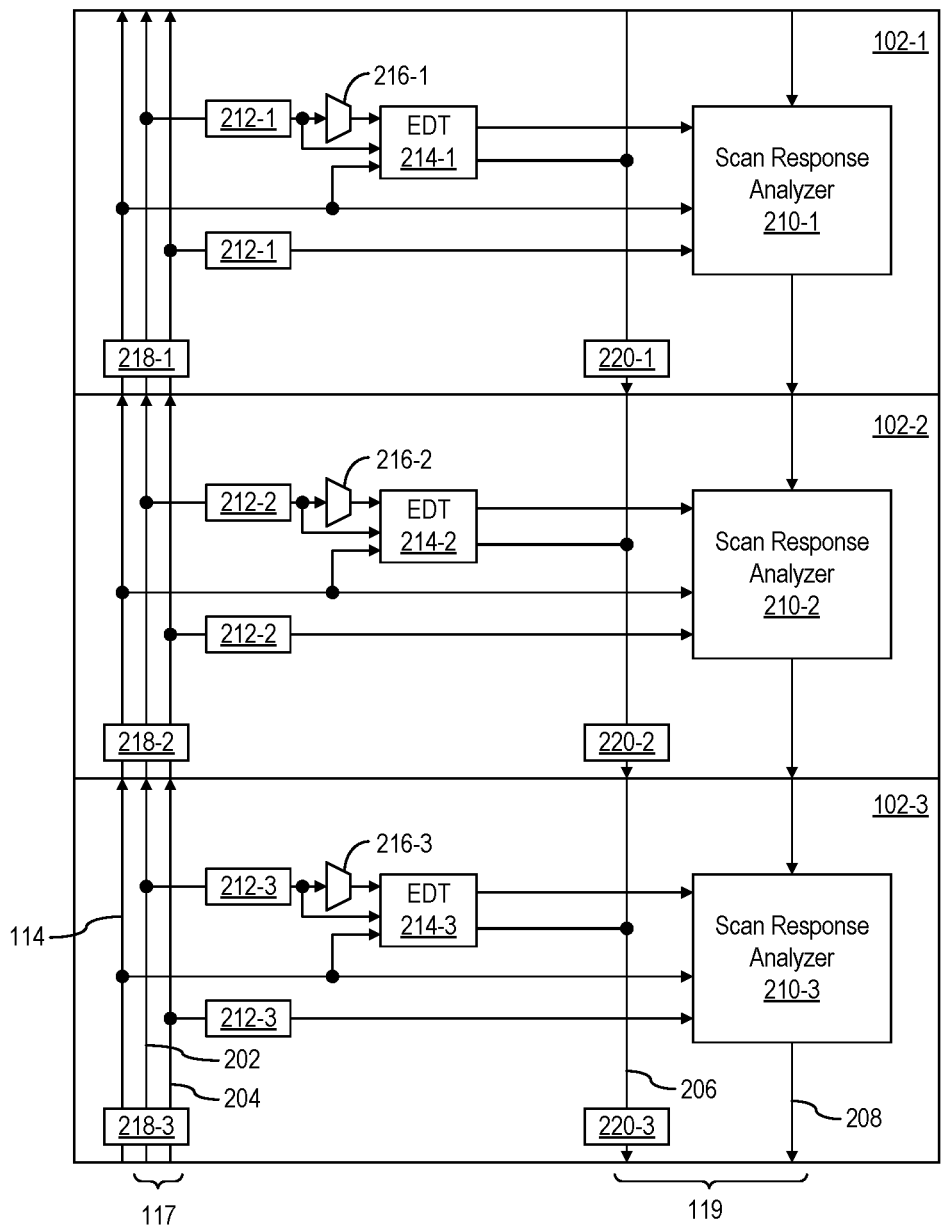
FIG. 2 illustrates an example group of circuit blocks of the array of FIG. 1.

FIG. 2 illustrates an example group of circuit blocks from array 104 of FIG. 1. For purposes of illustration, group 106 is shown. In the example of FIG. 2, each circuit block 102 has a same scan interface 112. In the example of FIG. 2, the various channels that form scan interface 112 and provide connectivity to circuit blocks 102 are shown in greater detail.

For example, scan control channel 114 may include four scan control signals. The scan control signals that form scan control channel 114 may include a scan clock signal referred to as "scan_clk_n," a scan enable signal referred to as "scan_en_n," a scan mode reset signal referred to as "scan_mode_rst_n," and a scan Embedded Deterministic Test (EDT) update signal referred to as "scan_edt_update_n." The signals scan_clk_n, scan_en_n, and scan_mode_rst_n may be provided to functional flip-flops (FFs) within circuit blocks 102 of IC 100 for testing purposes. The scan_edt_update_n signal may be provided to EDTs of circuit blocks 102 (e.g., not provided to functional FFs). Scan input channel 117 includes two or more scan input signals 202 formed of one or more scan control input signals and two or more scan data input signals. Scan input channel 117 further includes two or more scan mask input signals 204. Scan output channel 119 includes one or more scan control output signals 206 and two or more scan data output signals 208.

Scan input signals 202 may include "K" 1-bit scan control input signals, where K is an integer having a value of one or more than one, and "L" 1-bit scan data input signals, where L is an integer having a value of two or more than two. Scan mask input signals 204 may include L scan mask input channels. Thus, scan input channel 117 includes at least 5 input signals. Scan output channel 119 may include scan control output signals 206 and scan data output signals 208. In an example implementation, scan output channel 119 may include K 1-bit scan control output signals 206 and L 1-bit scan data output signals 208. In another example implementation, the number of scan data input signals may differ from the number of scan data output signals. The number of scan mask input signals 204 is the same as the number of scan data output signals 208.

As pictured, signals of scan control channel 114 and signals of scan input channel 117 traverse through one or more FFs 218 in each respective circuit block 102. Similarly, scan control output signals 206 traverse through one or more FFs 220 in each circuit block 102. Appreciably, the number of FFs on each of the signals shown will be the same in the various circuit blocks 102. Thus, as these signals propagate up (down) through circuit blocks in a group, a same delay is incurred in each circuit block 102 corresponding to FFs 218 (FFs 220).

In the example, the scan control channel 114 and the scan input channel 117 are propagated through circuit blocks 102 to adjacent circuit blocks 102. For example, each of scan control channel 114 and scan input channel 117 propagates from circuit block 102-1 to circuit block 102-2, and from circuit block 102-2 to circuit block 102-3. Portions of scan output channel 119 propagate from one circuit block 102 to the next while others are provided to neighboring scan response analyzers (SRAs) 210. For example, scan control output signals 206 propagate from circuit block 102-1 to circuit block 102-2, and from circuit block 102-2 to circuit block 102-3. Scan data output signals 208 are output the EDT to SRA 210 and may propagate from one SRA 210 to the next adjacent SRA 210. For example, scan data output signals 208 may be output from an EDT such as EDT 214-1 to SRA 210-1. Continuing with the example, scan data output signals 208 may be output from scan response analyzer (SRA) 210-1 to SRA 210-2, and from SRA 210-2 to SRA 210-3. Thus, in terms of DFT circuitry, each of circuit blocks 102 has a same scan interface 112.

In the example of FIG. 2, scan input channel 117 including scan input signals 202 and scan mask input signals 206 are latency matched to each circuit block 102. Latency matching ensures that data propagated on such signals arrives at each of circuit blocks 102-1, 102-2, and 102-3 at the same time. To facilitate latency matching, programmable delays 212 are inserted on scan input signals 202 and on scan mask input signals 204 for each respective circuit block 102. In the example of FIG. 2, programmable delays 212 are implemented within the respective circuit blocks 102. It should be appreciated that each programmable delay 212 may be independently programmed to provide a particular amount of delay that is specific to that individual programmable delay. In an example implementation, programmable delays 212 may be programmed using IJTAG signals. In other example implementations, programmable delays 212 may be located outside of circuit blocks 102.

Each circuit block 102 includes an EDT circuit 214. Within each circuit block 102, EDT 214 is connected to SRA 210. EDT 214 may include decompressor circuitry and compactor circuitry. The decompressor circuitry and the compactor circuitry may operate as interfaces that couple to circuitry under test. The circuitry under test may be located elsewhere in circuit block 102. The decompressor circuitry is capable of decompressing test data received on scan input signals 202 and providing the decompressed test data to the circuitry under test. The circuitry under test includes any scan chains of circuit block 102. The compactor circuitry is capable of connecting to the scan chain outputs of the circuitry under test, compressing the scan test responses, and providing the compressed scan test responses to SRA 210. The circuitry under test also includes the functional circuitry of each circuit block 102.

GSR 120 outputs the testing data as the various channels described herein to the respective circuit blocks 102. EDTs 214 receive time aligned scan input signals 202. Each circuit block 102 further includes an extest multiplexer 216 through which one or more of scan input signals 202 may be selectively routed for purposes of extesting. Time aligned scan mask input signals 204 are provided to SRAs 210. The EDTs 214 and SRAs 210 receive scan control channel 114.

Output from the EDTs 214 is provided to the respective SRAs 210 in each circuit block 102 of the active circuit blocks 102. Each of SRAs 210 is capable of implementing one of a plurality of different scan response capture modes under the control of GSR 120. In one example scan response capture mode, scan test responses from the EDTs 214 may be captured locally within the respective SRAs 210 to generate a test status indicator. In another example scan response capture mode, scan test responses from the EDTs 214 may be forwarded by SRAs 210 to GSR 120 to be output to ATE 124. GSR 120 controls the scan data that flows to the different groups of circuit blocks 102. IJTAG circuitry 126 may provide IJTAG signals to circuit blocks 102 to implement a particular scan response capture mode in the respective SRAs 210 of the active circuit blocks 102. Scan response capture modes are described in greater detail herein in connection with FIG. 6. IJTAG circuitry 126 is further capable of providing IJTAG signals to circuit blocks 102 to program programmable delays 212 to ensure that data provided to the respective circuit blocks 102 is time aligned to balance latencies in signal paths.

Figure 3:
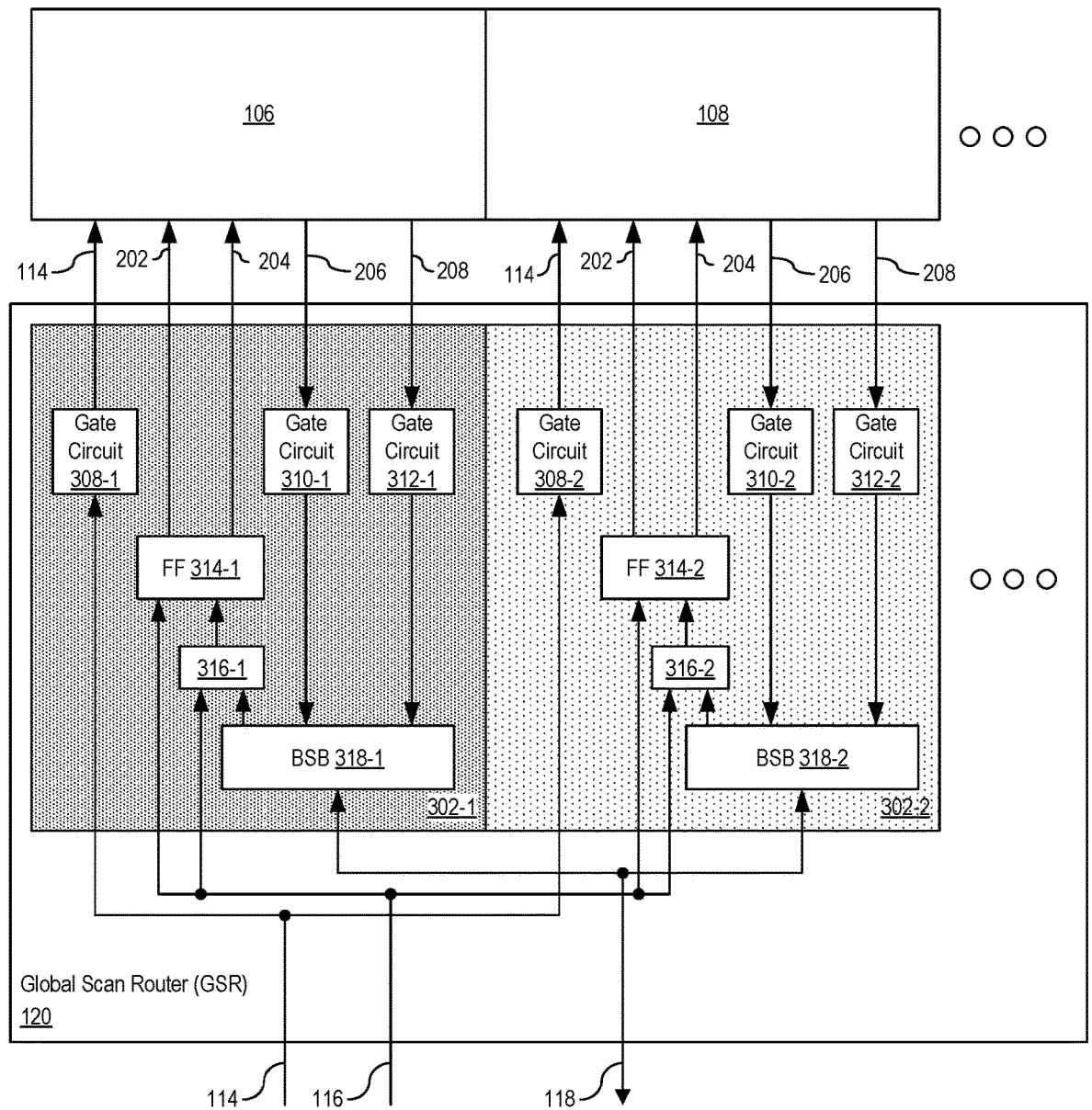
FIG. 3 illustrates an example implementation of a global scan router.

FIG. 3 illustrates an example implementation of GSR 120. In the example of FIG. 3, GSR 120 includes a plurality of router tiles 302. Each router tile 302 is capable of operating as an interface for a group of circuit blocks 102 located in array 104. For purposes of DFT scan testing, testing data for each group of circuit blocks 102 flows through a particular router tile. For example, router tile 302-1 is coupled to circuit blocks 102 of group 106. Router tile 302-2 is coupled to circuit blocks 102 of group 108. For purposes of illustration group 110 and the router tile connected thereto is not shown in FIG. 3. Though not shown in FIG. 3, IJTAG signals may be distributed from IJTAG circuitry 126 to circuit elements located in GSR 120 and/or to circuit elements located in one or more or all of circuit blocks 102 of array 104.

Each router tile 302 includes circuitry for processing primary scan control channel 114, primary scan input channel 116, and primary scan output channel 118 for a given group of circuit blocks 102. In the example of FIG. 3, each router tile 302 includes gate circuits 308, 310, and 312. Gate circuit 308 may be used to gate signals of scan control channel 114. It should be appreciated that gate circuit 308 may include an integrated clock gating circuit to gate any clock signals contained in scan control channel 114. Non-clock signals of scan control channel 114, for example, may be gated using AND gates. As such, particular groups of circuit blocks 102 may be activated and deactivated by, at least in part, engaging particular ones of gate circuits 308 in one or more router tiles 302 to prevent primary scan control channel 114 from passing signals (e.g., clock and/or data) to circuit blocks 102 of particular groups. Gate circuits 310, 312 may be used to gate scan control output signals 206 and scan data output signals 208, respectively. For example, gate circuits 310 may be used to gate signals L−1:0 of scan control output signals 206. Gate circuits 312 may be used to gate signals K−1:0 of scan data output signals 208.

In one aspect, each gate circuit illustrated in FIG. 3 may include a control register including an enable bit that may be written via IJTAG circuitry 126. In response to the enable bit being set, the gate circuit gates any received signals. Gating a signal means that the gate circuit outputs static signal(s) that do not toggle, effectively turning the received signal(s) off and preventing such signal(s) from propagating beyond the gate circuit. In response to the enable bit being cleared, the gate circuit does not gate the received signal(s). As such, the signal(s) are allowed to propagate beyond the gate circuit.

As illustrated, each router tile 302 includes a FF 314. FF 314 receives primary scan input channel 116. FF 314 outputs scan input signals 202 and scan mask input signals 204 which may be referred to as "scan_msk_chnl[L−1:0]. Scan input signals 202 may include scan control input signals referred to as scan_cntrl_chanl[K−1:0] and scan data input signals referred to as scan_data_chnl[L−1:0]. Each router tile 302 further includes switching circuitry (switch) 316 and a bidirectional scan bus circuit (BSB) circuit 318. As pictured, BSB circuit 318 is connected to scan output channel 118. In one aspect, BSB circuit 318 is configurable so that the signals of scan output channel 118 may be used as inputs. In one or more embodiments, BSB circuit 318 may be configured, on a per bit basis, so that one or more of the output signal paths of scan output channel 118 function as input signal paths. Once a signal path is configured to operate as an input, the signal path may be used to receive a mask input signal. BSB circuit 318 is capable of outputting signals received via primary scan output channel 118 (when BSB circuit 318 reconfigures signal path(s) as inputs) to switch 316. Switch 316 is configurable to output either signals received on primary scan input channel 116 or signals received via primary scan output channel 118 as scan mask input signals 204 to circuit blocks 102.

In the example of FIG. 3, control signals for gate circuits 308, 310, and 312, switches 316, and BSB circuits 318 may be provided from IJTAG circuitry 126. GSR 120 is capable of pipelining data to circuit blocks 102 in the respective groups. Further, in cases where two or more groups are activated concurrently so that circuit blocks 102 in the activated groups may be tested in parallel, the latency among the groups should be aligned using programmable delays as previously described. BSB circuits 318 are capable of receiving the scan output channel 119 including scan control output signals 206 and scan data output signals 208 from each group and outputting the data via primary scan output channel 118.

Figure 4A:
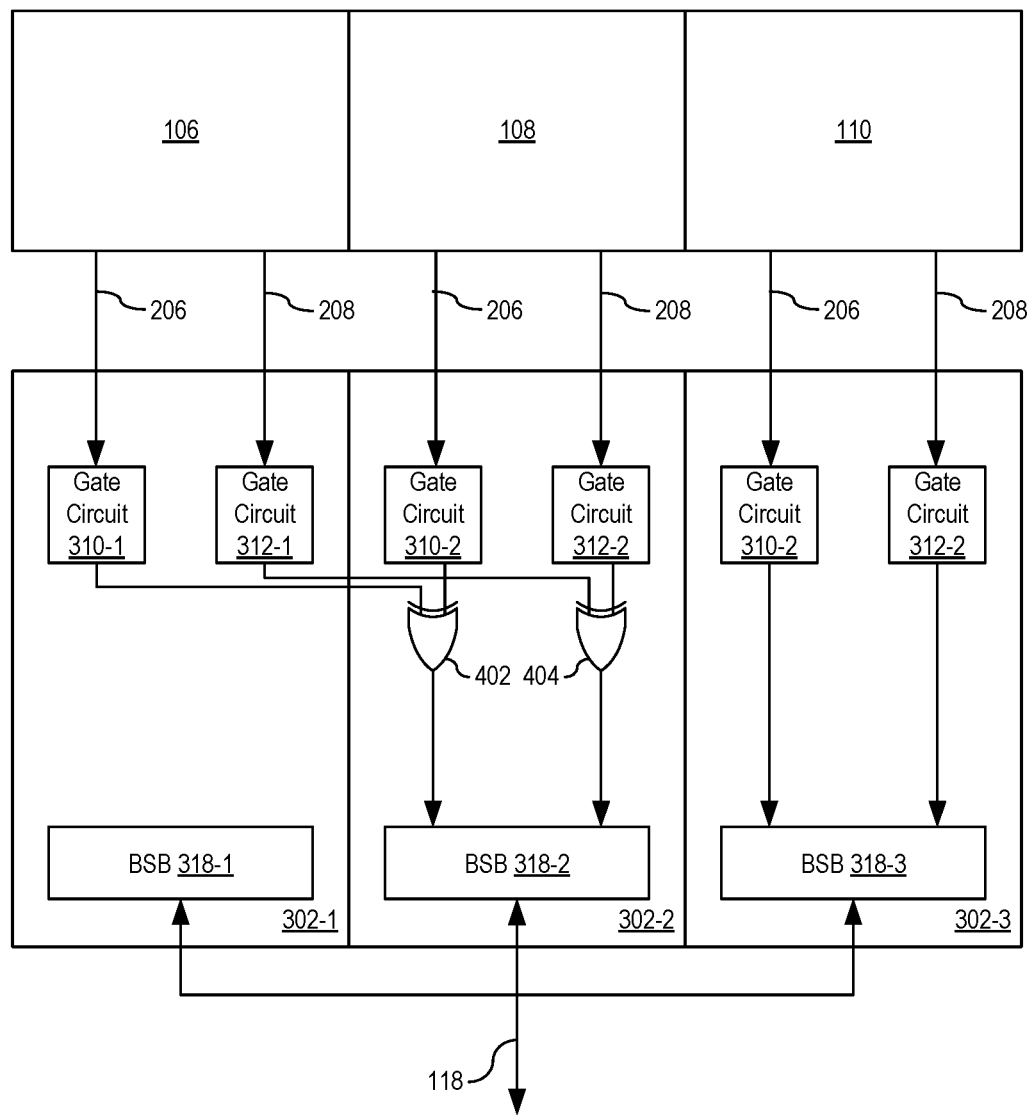
FIGS. 4A and 4B illustrate example output signal paths for a global scan router.
Figure 4B:
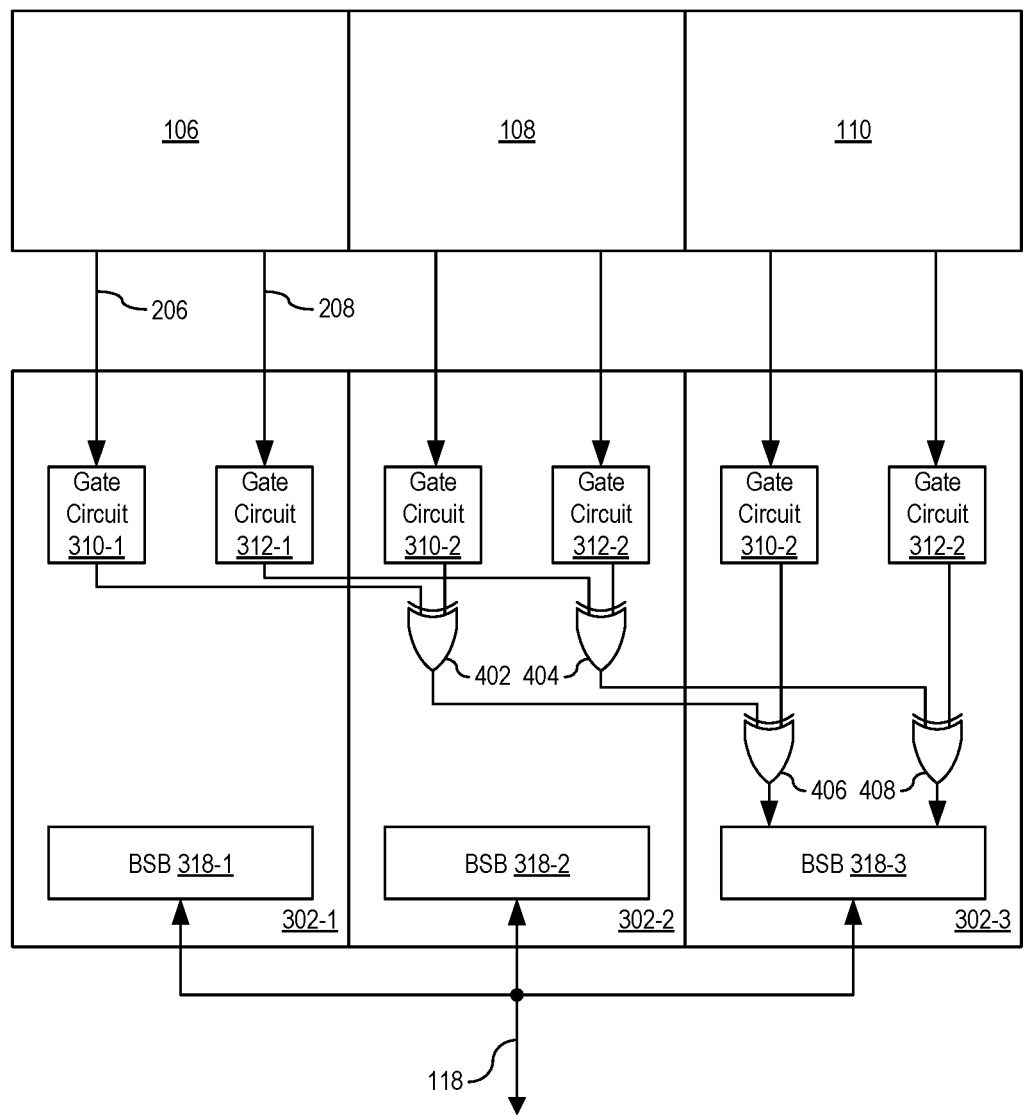

FIGS. 4A and 4B illustrate other example implementations of GSR 120. The examples of FIGS. 4A and 4B illustrate alternative example output signal paths for GSR 120. For purposes of illustration, input circuitry is not shown. The examples of FIGS. 4A and/or 4B may be used in cases where the ATE 124 does not have a sufficient number of pins or channels to receive the output signals from each group of circuit blocks 102 separately. Accordingly, the output of two or more groups may be combined onto same output channels using XOR circuitry.

In the example of FIG. 4A, the output signals from gate circuits 310-1 and 312-1 of tile router tile 302-1 are connected to inputs of XOR gates 402 and 404, respectively, of router tile 302-2. Inputs of XOR gates 402 and 404 also receive output signals from gate circuits 310-2 and 312-2, respectively. The outputs from XOR gates 402 and 404 are connected to BSB 318-2. The example of FIG. 4A allows the output channels from group 106 to be combined with the output channels of group 108 to reduce the number of physical output channels needed in the ATE 124.

In the example of FIG. 4B, the output signals from gate circuits 310-1 and 312-2 of tile router tile 302-1 are connected to inputs of XOR gates 402 and 404, respectively, of router tile 302-2. Inputs of XOR gates 402 and 404 also receive output signals from gate circuits 310-2 and 312-2, respectively. The outputs from XOR gates 402 and 404 are connected to inputs of XOR gates 406 and 408, respectively, of router tile 302-3. Inputs of XOR gates 406 and 408 also receive output signals from gate circuits 310-3 and 312-3, respectively. The example of FIG. 4B allows the output channels from group 106 and group 108 to be combined with the output channel of group 110 to further reduce the number of physical output channels needed in ATE 124.

In other examples, more or fewer groups may be combined using XOR gates as shown. In another example, where more than three groups of circuit blocks 102 are included in IC 100, the output channels of three or more groups of circuit blocks may be combined with the output channels of another group using XOR gates. The particular number of groups that are combined in terms of output channels may vary according to the pin capacity of ATE 124.

Figure 5:
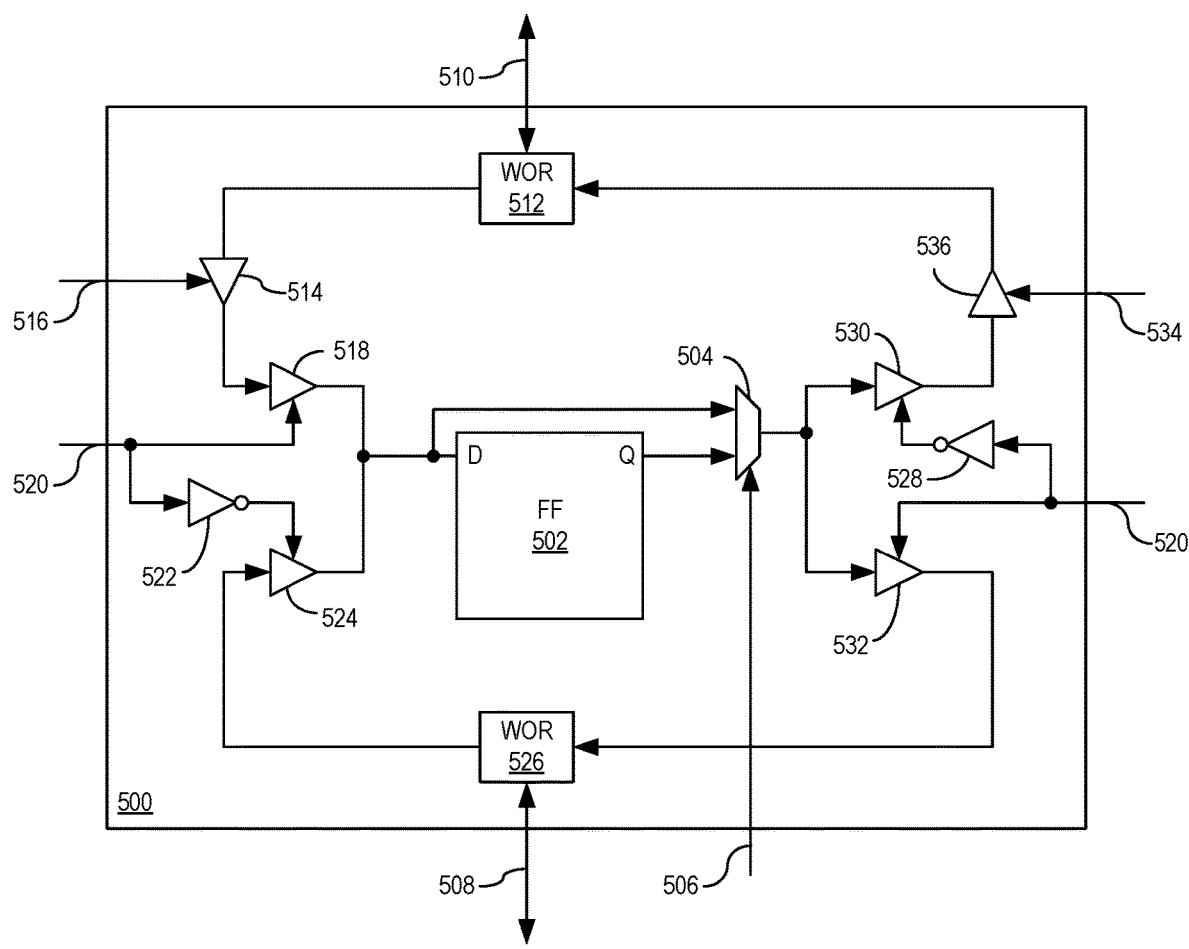
FIG. 5 illustrates an example implementation of a bidirectional scan bus (BSB) circuit.

FIG. 5 illustrates an example circuit architecture 500 that may be used to implement BSB circuit 318 of FIGS. 3 and 4. BSB circuit 318 is configurable so that selected signals of primary scan output channel 118 from GSR 120 may be used as input signals into GSR 120, that may then be provided to selected ones of circuit blocks 102 as scan mask input signals 204. The example circuit architecture of FIG. 5 is capable of processing a 1-bit signal. It should be appreciated that the circuit architecture of FIG. 5 may be replicated to form BSB circuit 318 for the number of bits required.

Circuit architecture 500 provides a configurable pipeline feature in that FF 502 may be bypassed. As illustrated, the signal provided to the D input of FF 502 is also directly connected to multiplexer 504. The output from FF 502 is also connected to multiplexer 504. Multiplexer 504 passes either the signal that is input to FF 502 or the signal output from FF 502 based on the state of pipeline bypass signal 506, which is provided to multiplexer 502 as a select signal.

In an example where circuit architecture 500 is configured to operate as an output, data received via signal 510 is output via signal 508. In that case, data is received via signal 510 by wire OR-gate (WOR) 512 and provided to tristate buffer 514. Tristate buffer 514 may be activated by way of signal 516 to pass data to tristate buffer 518. Direction select signal 520 may be asserted and provided to tristate buffer 518 to enable tristate buffer 518. Direction select signal 520 is provided to inverter 522, the output of which is provided to tristate buffer 524 thereby disabling tristate buffer 524. Disabling tristate buffer 524 prevents any signals from WOR 526 from propagating to the output of tristate buffer 524.

The output from tristate buffer 518 is connected directly to multiplexer 504 and directly to the input of FF 502. Multiplexer 504 passes the signal received directly from tristate buffer 518 or the signal output from FF 502 based on the state of signal 506. Direction select signal 520 is also provided to inverter 528, the output of which is provided to tristate buffer 530 thereby disabling tristate buffer 530. As such, the output from multiplexer 504 is not permitted to pass tristate buffer 530. Direction select signal 520 enables tristate buffer 532, which allows the output from multiplexer 504 to pass on to WOR 526 and out from circuit architecture 500 as signal 508 (e.g., as an output signal of primary scan output channel 118). Further, signal 534 may be provided to tristate buffer 536 to disable tristate buffer 536 to prevent any signals from passing tristate buffer 536 to WOR 512.

In an example where circuit architecture 500 is configured to operate as an input, data received via signal 508 is output via signal 510. Signal 510, for example, may be provided to switch 316 to convey a mask signal. In that case, data is received via signal 508 by WOR 526 and provided to tristate buffer 524. Tristate buffer 524 may be enabled by way of direction select signal 520 being provided to inverter 522 and the output of inverter 522 being provided to tristate buffer 524. The output from tristate buffer 524 is directly connected to the input of FF 502 and directly connected to the input of multiplexer 504. Multiplexer 504 passes either the output from tristate buffer 524 or the output from FF 502 based on the state of pipeline select signal 506. In this configuration, e.g., operating as an input, direction select signal 520 disables tristate buffer 518. Further, signal 516 disables tristate buffer 514 to prevent any signals from WOR 512 from passing to either FF 502 or to multiplexer 504.

Direction select signal 520 disables tristate buffer 532 to prevent signals from multiplexer 504 from passing to WOR 526. Direction select signal 520 is provided to inverter 528, which generates a signal that enables tristate buffer 530 to pass the signal output from multiplexer 504. The output from tristate buffer 530 is passed by tristate buffer 536, having been enabled by signal 534. The output from tristate buffer 536 is provided to WOR 512 and output from circuit architecture 500 via signal 510, which is coupled to switch 316. Switch 316 may pass the signal(s) received from circuit architecture 500 or signals received via primary scan input channel 116 as scan mask input signals 204.

In the example of FIG. 5, the various control signals such as signals 506, 516, 520, and 534 may be IJTAG signals that are provided to circuit architecture 500 from IJTAG circuitry 126. Thus, using IJTAG signals, circuit architecture 500 in each of the router tiles may be configured to operate as an input or as an output for particular signals. Alternatively, circuit architecture 500 may be used to reconfigure each signal of primary scan output channel 118 to operate as an input (or an output) as a group.

Figure 6:
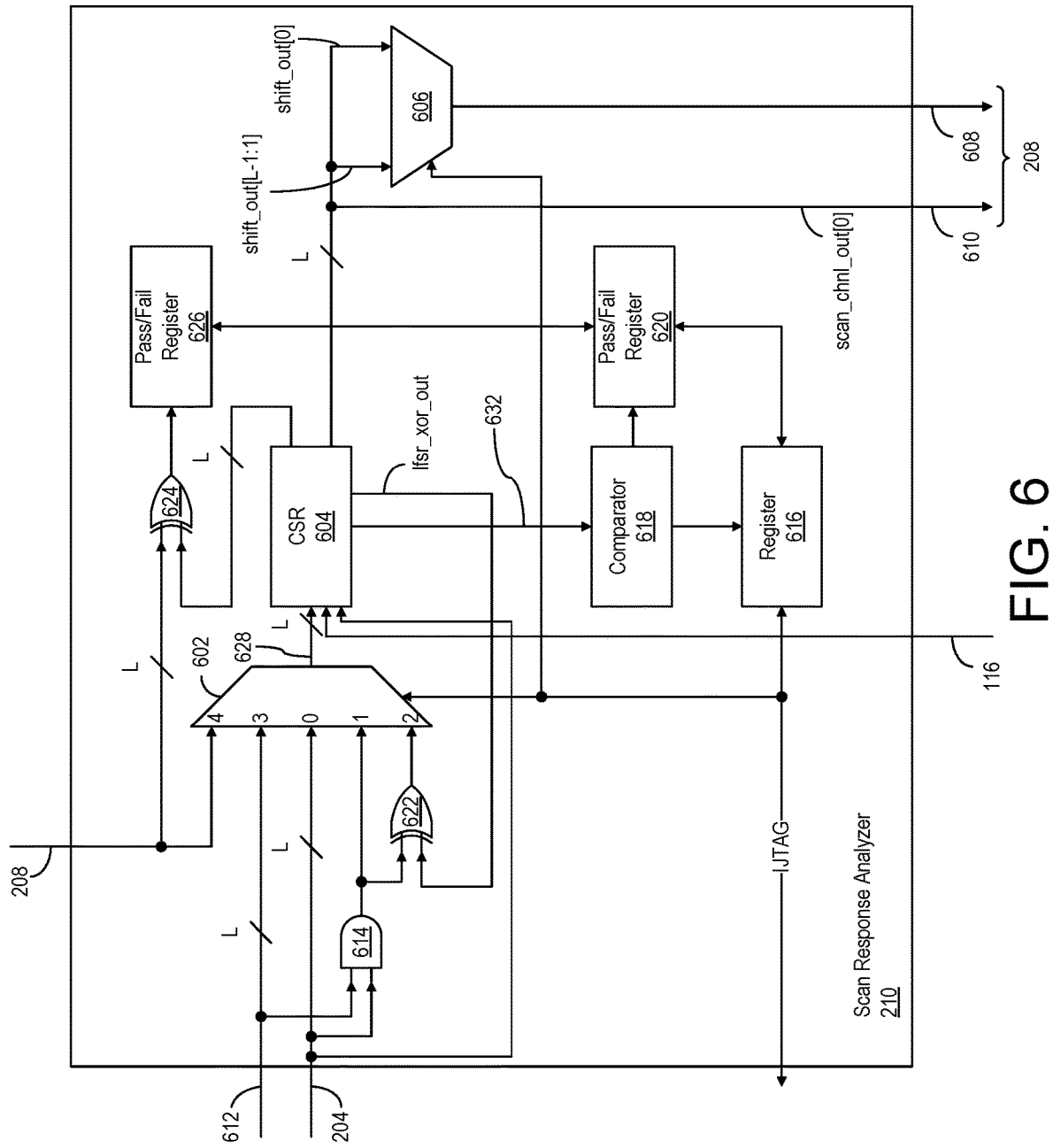
FIG. 6 illustrates an example implementation of a scan response analyzer (SRA) of a circuit block of the array.

FIG. 6 illustrates an example implementation of SRA 210 of a circuit block 102 of array 104. SRA 210 includes a multiplexer 602 having a plurality of inputs. Input 0 is connected to scan mask input signals 204. Input 1 is coupled to an output of AND gate 614. AND gate 614 applies scan mask input signals 204 to signals 612 as output from EDT 214. Signals 612 are referred to herein from time-to-time as "raw signals" in reference to unprocessed data output from EDT 214. Input 2 is coupled to an output of XOR gate 622. XOR gate 622 performs an XOR operation on the output of AND gate 614 and the lfsr_xor_out signal from configurable shift register (CSR) 604. Input 3 is coupled to signals 612, which are output from EDT 214. Input 4 is coupled to signals 208 from the SRA 210 of the circuit block 102 located above (e.g., the neighboring or adjacent circuit block) of array 104. It should be appreciated that input 4 receives signals 208 from an SRA 210 of a circuit block that is adjacent to the circuit block including the SRA of FIG. 6 and that is in the same group as the circuit block including the SRA of FIG. 6. For example, if the SRA 210 of FIG. 6 is SRA 210-2 of circuit block 102-2, the signal 208 shown in FIG. 6 that connects to input 4 of multiplexer 602 is from SRA-1 of circuit block 102-1.

Multiplexer 602 is coupled to CSR 604 via signal 628. CSR 604 is configurable to operate as a shift register or operate as a linear feedback shift register (LFSR). In the example, CSR 604 receives one or more signals of scan control channel 116. For example, CSR 604 may receive the scan_en_n (scan enable) and scan_clk_n (scan clock) signals of scan control channel 116. CSR 604 may be implemented as a plurality of CSRs where SRA 210 includes one CSR for each of the L signals provided thereto. CSR 604 may only shift when scan_en_n is set to 1. When CSR 604 is used as an LFSR, scan_en_n is further qualified with scan mask input signals 204 and only shifts when both scan mask input signals 204 and scan_en_n are high.

CSR 604 is coupled to multiplexer 606, comparator 618, XOR gate 622, and XOR gate 624. XOR gate 624 is further coupled to signals 208 from an SRA of an adjacent circuit block 102 located above in this example. An output of XOR gate 624 is coupled to a pass/fail (PF) register 626. Comparator 618 is coupled to register 616 and to a PF register 620. Comparator 618 is capable of receiving, via signal 632, a signature from CSR 604 when CSR 604 is configured to operate as an LFSR.

SRA 210 is capable of implementing a plurality of different scan response capture modes and switching between the scan response capture modes in real time based on control signals (e.g., IJTAG signals) provided thereto. SRA 210, for example, is capable of switching between scan response capture modes 0-4 in real time during testing and/or debug based on particular control signals. In the example, the particular scan response capture mode that is implemented is determined by IJTAG signals provided to multiplexer 602 as select signals to determine which of the inputs is passed to CSR 604. Further, the particular scan response capture mode implemented may be determined by controlling operation of CSR 604 via scan input mask signals 204 and signals scan_en_n and scan_clk_n of primary scan control channel 114.

For purposes of describing the various scan response capture modes below, as defined herein, the term "scan test response," means data, e.g., raw data, that is shifted out from an EDT, data shifted out from an EDT that is masked, or a signature generated by a CSR operating as an LFSR. As defined herein, the term "test status indicator" means a result from an operation that performs an analysis or comparison of a scan test response with a reference scan test response. A test status indicator is generated locally within a circuit block 102. A test status indicator specifies, based on the analysis or comparison performed locally within the SRA 210, whether a scan test was passed. As defined herein, the term "reference scan test response" means an expected scan test response. The reference scan test response is typically one expected from correct operation of a circuit. A reference scan test response may be an expected signature.

In scan response capture mode 0, multiplexer 602 is configured to pass the signal at input 0 on as signal 628. Accordingly, multiplexer 602 passes scan input mask signals 204. Further, CSR 604 is configured to operate as a shift register. In one aspect, scan response capture mode 0 may be used to initialize CSR 604 to a specific seed before using CSR 604 as an LFSR. Once initialized with the appropriate seed, the scan response capture mode may be changed to one in which CSR 604 operates as an LFSR.

In another aspect, scan response capture mode 0 may be used to validate scan channel connectivity from a primary input to a primary output of IC 100. In scan response capture mode 0, for example, data from CSR 604 may be shifted out of circuit block 102 via multiplexer 606 as scan data output signals 208 to GSR 120 for observation in ATE 124.

In the example of FIG. 6, signal 608 may be bits L−1:1 of the output signal. Signal 610 may be bit 0 of the output signal and used for purposes of extest to be described herein in greater detail below. Scan response capture mode 0 may be used to ensure that the signal path involving the signals passed by multiplexer 602 is functioning properly. In scan response capture mode 0, any data shifted into circuit block 102 via signals of scan input channel 116 may be output from the circuit block 102.

In scan response capture mode 1, multiplexer 602 is configured to pass the signal at input 1 as signal 628. Accordingly, multiplexer 602 passes the output of AND gate 614. Scan response capture mode 1 may be used for debug purposes. The output from AND gate 614 is the masked output (e.g., masked version of signal 612) from EDT 214. In scan response capture mode 1, the masked EDT output may be passed to CSR 604, operating as a shift register, to shift the data out of circuit block 102 via multiplexer 606. This masked EDT output can be sent out from IC 100 for observation by ATE 124.

In the example of FIG. 6, signals 612 from EDT 214 are provided to an input of AND gate 614 along with scan mask input signals 204. The result of the logical AND operation performed by AND gate 614 is provided to input 1 of multiplexer 602. The use of scan mask input signals 204 allow don't care bits (X bits) in signals 612 to be dealt with by overriding the X bits with mask values provided by scan mask input signals 204. For example, whenever an X bit is provided via signals 612, a corresponding 0 bit may be provided via scan mask input signals 204 to replace the X bit with 0. This operation ensures that predictable output is processed from EDT 214 for purposes of performing a comparison of the results locally within SRA 210 or providing predictable output to ATE 124.

In another aspect, scan response capture mode 1 may be used to compare the masked output from EDT 214 (e.g., the signal at input 1 of multiplexer 602) with the masked output from an EDT of an adjacent circuit block 102. For example, the masked output from EDT 214 may be passed from multiplexer 602 to CSR 604, which, operating as a shift register, may output the data to multiplexer 606 and to XOR gate 624. XOR gate 624 also receives the masked EDT output from an adjacent circuit block 102. XOR gate 624 may compare the time synchronized masked EDT data from the two adjacent circuit blocks 102 and store the result as a test status indicator in PF register 626. Thus, in scan response capture mode 1, SRA 210 is capable of determining whether circuit block 102 passed or failed a scan test locally within circuit block 102 itself and storing the test status indicator therein locally.

Thus, scan response capture mode 1 allows the scan test response from each circuit block 102 to be compared with the scan test response of a neighboring or adjacent circuit block in the same group with the result of the comparison being stored in a local PF register. For purposes of illustration, consider the case where SRA 210 of FIG. 6 is SRA 210-2 of circuit block 102-2. In that case, the scan test response from SRA 210-1 (e.g., the above adjacent circuit block in the same group) may be provided to XOR gate 624. XOR gate 624 performs an XOR operation on the scan test response from circuit block 102-1 and the scan test response passed through CSR 604 of SRA 210-2. The result of the XOR operation is stored in PF register 626 as a test status indicator. Thus, SRA 210-2 is capable of determining whether the scan test response of circuit block 102-2 matches the scan test response of circuit block 102-1 and storing the result therein in SRA 210-2.

In scan response capture mode 2, multiplexer 602 is configured to pass the signal at input 2 as signal 628. Accordingly, multiplexer 602 passes the output generated by XOR gate 622. In scan response capture mode 2, CSR 604 is configured to operate as an LFSR. CSR 604 generates a signature based on the data received from multiplexer 602 and the polynomial implemented by CSR 604. The signature generated by CSR 604 may be compared with a reference scan test response stored in register 616. More particularly, comparator 618 is capable of comparing the signature of CSR 604, as output by signal 632, with the reference scan test response of register 616. Comparator 618 stores the result of the comparison as a test status indicator in PF register 620. Thus, in scan response capture mode 2, SRA 210 is capable of determining whether circuit block 102 passed or failed a scan test locally within circuit block 102 itself and storing the test status indicator therein.

In another aspect, the signature generated and stored in CSR 604 may be shifted out of SRA 210 onto scan data output signal 208. The signature may be shifted out by changing the scan response capture mode, once the signature is generated, from scan response capture mode 2 to scan response capture mode 4.

In scan response capture mode 3, multiplexer 602 is configured to pass the signal at input 3 as signal 628. Accordingly, multiplexer 602 passes signal 612, which is the data output from EDT 214. In scan response capture mode 3, CSR 604 is configured to operate as a shift register to shift signal 612 out from circuit block 102 via multiplexer 606 to ATE 124.

In scan response capture mode 4, multiplexer 602 is configured to pass the signal at input 4. Accordingly, multiplexer 602 is configured to pass signal 208 as received from an adjacent circuit block 102. In scan response capture mode 4, the CSRs 604 of all tiles in a group may be concatenated. Accordingly, values from the CSRs 604 may be shifted out on scan output channel 208 to ATE 124.

Referring to the foregoing scan response capture modes, certain operational features of SRA 210 may be set using IJTAG circuitry. For example, the select signal provided to multiplexer 602 may be IJTAG signals or generated from IJTAG signals. Register 616 may be loaded with a reference scan test response using IJTAG circuitry. Further, PF register 620 and/or PF register 626 may be read via IJTAG circuitry. In one or more other example implementations, the contents of PF registers 620 and/or 626 may be shifted out of circuit block 102 via multiplexer 606. For ease of illustration, such signals and connectivity are not illustrated in the example of FIG. 6.

In the example of FIG. 6, one or more scan response capture modes support the shifting out of scan test responses where such scan test responses may be compared with expected scan test responses outside of IC 100. The ATE 124, for example, may perform the comparisons to determine whether scan tests were passed. One or more other scan response capture modes support the comparison and/or analysis of scan test responses within the respective circuit blocks 102 where comparisons are performed locally within the SRAs 210 with the results of the comparisons, or tests, being stored locally therein as test status indicators that may be read out via IJTAG or shifted out via scan data output signals 208.

SRA 210 further supports extest operations. Within DFT, intest generally refers to testing the functionality of circuitry within circuit blocks 102. Extest refers to testing the interface or boundary between neighboring circuit blocks 102. Extest is typically conducted separately from intest. In the example of FIG. 6, extest may be performed using one signal. As illustrated, the output from CSR 604 is provided to multiplexer 606. The output signal from CSR 604, referred to as "shift_out" is subdivided where the signal scan_chnl_out[0], which is used for extest, may be multiplexed onto any one of the signals shift_out[L−1:0]. IJTAG signals may be provided to multiplexer 606 as select signals to control which of signals shift_out[L−1:0] is multiplexed.

Figure 7:
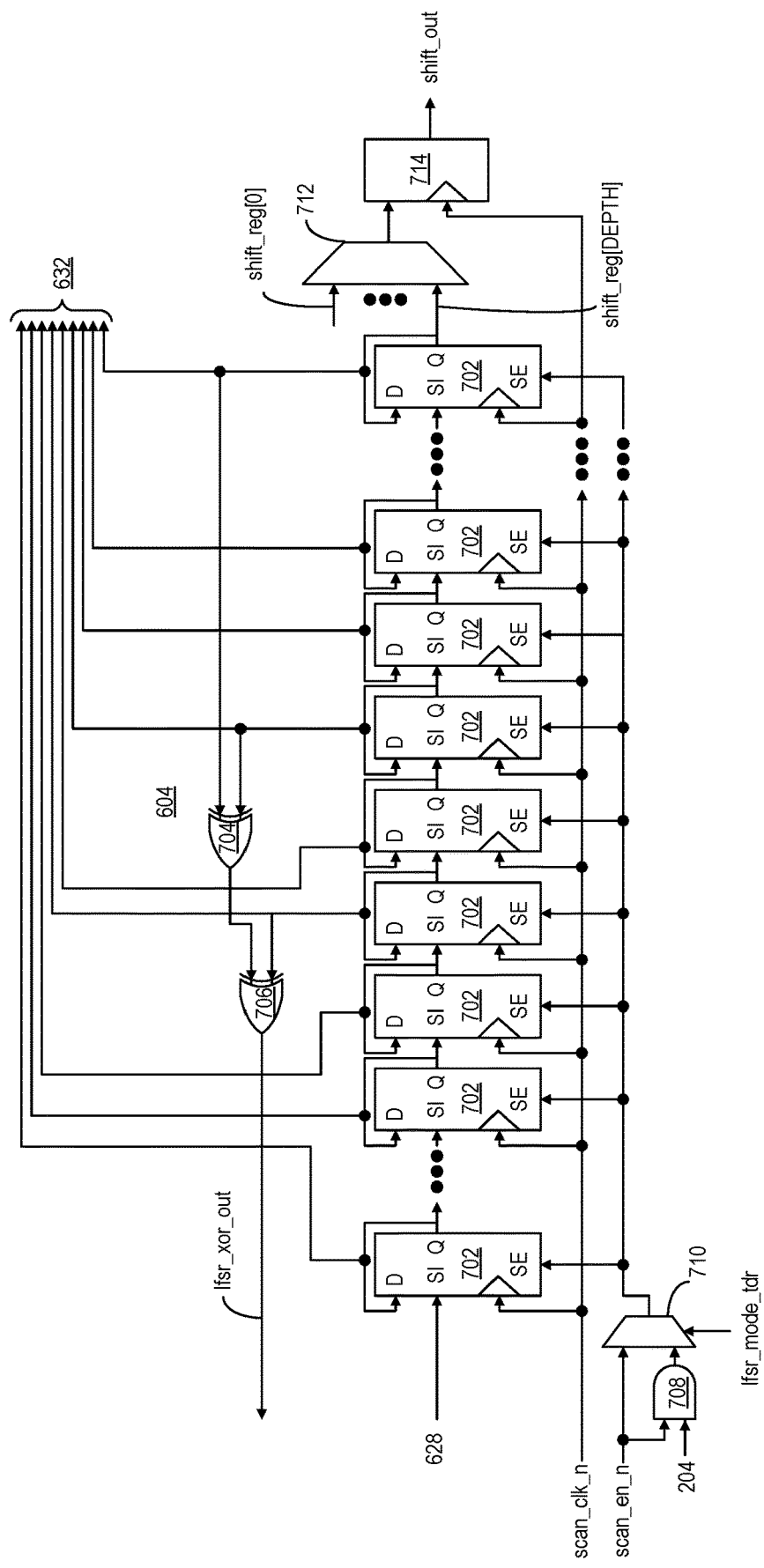
FIG. 7 illustrates an example implementation of a configurable shift register of a scan response analyzer.

FIG. 7 illustrates an example implementation of CSR 604 of FIG. 6. In the example of FIG. 7, CSR 604 includes a plurality of FFs 702, XOR gates 704, 706, AND gate 708, multiplexer 710, multiplexer 712, and a latch 714. Input signal 628 is received from multiplexer 602 of FIG. 6. The depth of CSR 604 may be implemented to have a depth of "DEPTH," wherein the value of DEPTH is set to the larger of the size of polynomial that is to be used and a size to balance delays. In the example, CSR 604 only shifts when the scan_en_n signal is asserted.

When CSR 604 is configured to operate as an LFSR to generate a signature, referred to as the "LFSR mode," the lfsr_mode_tdr signal is high. In the LFSR mode, the lfsr_xor_out signal is XORed with the masked output from EDT 214 by XOR gate 622 of FIG. 6. Input 2 of multiplexer 602 is passed to CSR 604. With the lfsr_mode_tdr signal high, the lfsr_xor_out signal creates a feedback loop so that CSR 604 may continue to capture the signature. The scan input mask signals 204 are used to block propagation of X bits from multiplexer 602 using AND gate 708. That is, with the lfsr_mode_tdr signal high, the signal from AND gate 708 is passed by multiplexer 710. Scan mask input signals 204 ensure that each don't care bit is set to 0. The resulting signal from multiplexer 710 is provided to the scan enable (SE) input of each FF 702. When the output from multiplexer 710 is low (e.g., 0), FFs 702 retain their values and do not shift values. This prevents don't care bits from entering the signature that is generated by CSR 604.

In one aspect, in operating in LFSR mode, CSR 604 implements a linear polynomial to provide for maximum range. By using a linear polynomial, data toggling on the input side guarantees that CSR 604 goes through the entire range of bit combinations. Use of a linear polynomial of sufficient size reduces the likelihood of aliasing where different input combinations result in the same signature.

In cases where CSR 604 operates as a shift register, the signal lfsr_xor_out is discarded or not used. For example, multiplexer 602 passes a signal other than the signal connected to input 2. In that case, CSR 604 operates as a shift register capable of providing a programmable delay. Though not illustrated in the example of FIG. 7, the output of each FF 702 (e.g., the "Q" output) is also coupled to an input of multiplexer 712.

The data stored in FFs 702 may be propagated through the chain of FFs to multiplexer 712 and output via latch 714 as the shift_out signal.

Figure 8:
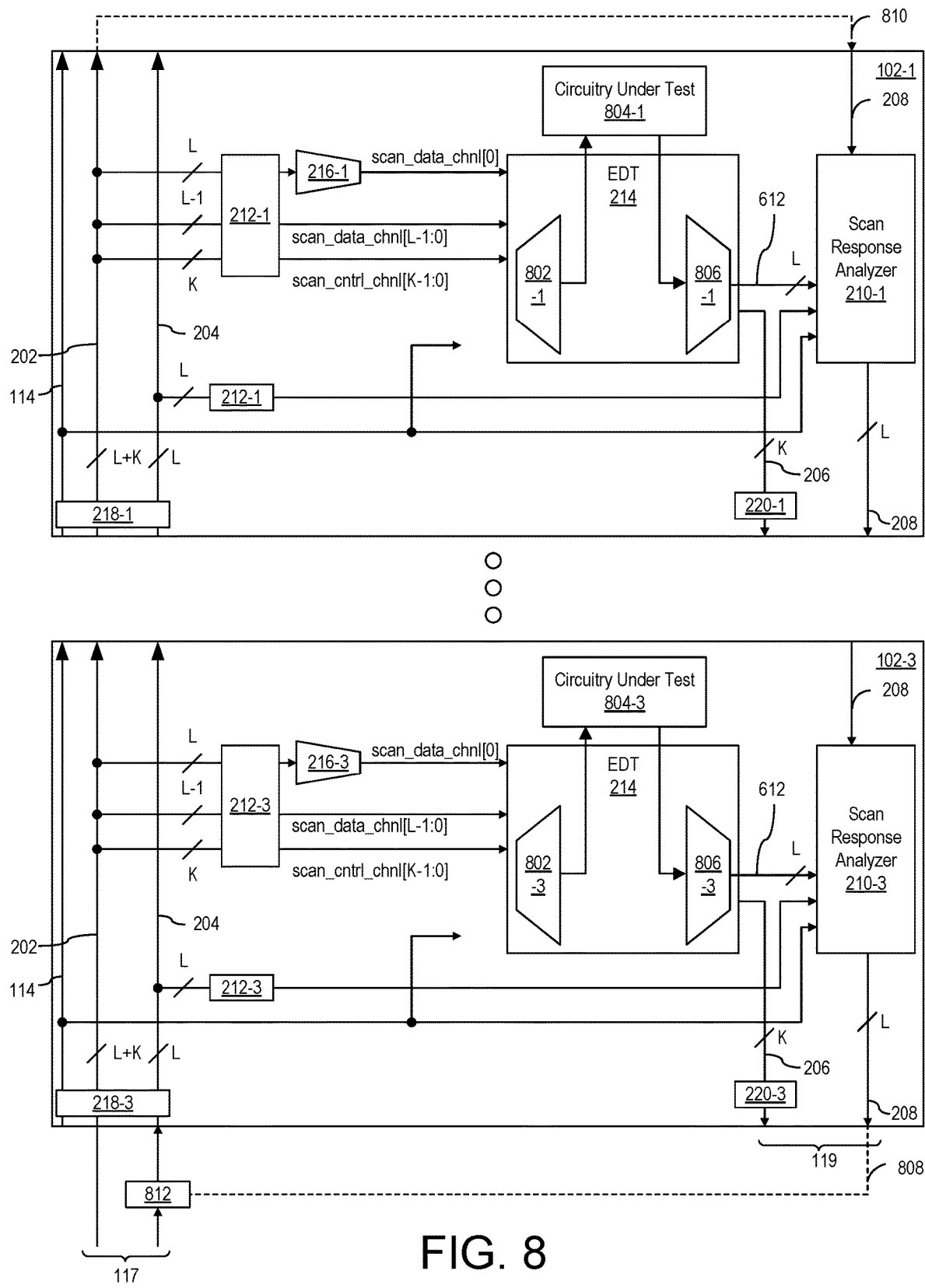
FIG. 8 illustrates an example implementation of a circuit block of the array and shows an example implementation of loopback paths.

FIG. 8 illustrates an example implementation of a circuit block 102 of array 104. In the example of FIG. 8, example loopback path implementations are shown that may be used in implementing scan response capture mode 2 where the scan test response of a circuit block is compared with the scan test response of a neighboring or adjacent circuit block 102. Further, decompressor circuitry 802, circuitry under test 804, and compressor circuitry 806 are illustrated. In the example of FIG. 8, decompressor circuitry 802 may receive the scan_data_chnl[L−1:0] signals including the scan_data_chnl[0] signal output from extest multiplexer 216. Compressor circuitry 806 outputs signal 612 that is provided to CSR 604.

In the example, loopback paths 808 and 810 are illustrated. Loopback paths 808 and 810 may be used to facilitate the operation of scan response capture mode 1 in which circuit blocks 102 compare test results with those of an adjacent circuit block. In such cases, loopback paths 808 and 810 may be used for circuit blocks located at the beginning and end of a chain of circuit blocks of a same group. For purposes of illustration, circuit blocks 102-1 and 102-3 of group 106 are shown. Though not adjacent in the physical sense, circuit blocks 102-1 and 102-3 may be considered adjacent for purposes of scan response capture mode 2 using loopback paths 808 and 810. In the example of FIG. 8, circuit block 102-3 is capable of providing a scan test response from SRA 210-3 to SRA 210-1 of circuit block 102-1 by way of loop back paths 808 and 810. Because of FFs 218 and 220, the latency at SRA 210-1 may be adjusted.

Referring to FIG. 8, in the case of performing an intest DFT test, array 104 may be prepared for testing as follows. The scan input mask signals 204 and CSR 604 may be initialized to flush out any don't care bits. In one aspect, by default, multiplexer 602 of SRA 210 provides scan input mask signals 204 (e.g., input 0) to CSR 604 for this purpose. For example, in response to reset or power on of IC 100, multiplexer 602 may be placed in the state that passes input 0. This allows each scan input mask signal 204 and CSR 604 to be initialized concurrently.

In preparation for testing, programmable delays 212 may be programmed (e.g., individually) so that each circuit block 102 in a same group is latency matched. In one aspect, by default, each programmable delay 212 initially selects the largest possible delay to ensure that initialization of scan input mask signals 204 and CSR 604 may be performed without additional programming. SRA 210 may then be configured to operate in a particular scan response capture mode using control IJTAG signals. In the case where the scan response capture mode compares test results with those of an adjacent circuit block 102, pipeline latency should be adjusted accordingly for the first circuit block 102 of the group in view of the loopback paths providing signals from the last circuit block 102 of the group. It should be appreciated that input pipeline latency should be matched among circuit blocks 102 in a same group for each of the scan response capture modes. With the scan response capture mode set, scan testing may be performed. The scan test response and/or test status indicators of each circuit block 102 may be observed in a manner that depends on the particular scan response capture mode selected.

In the case of performing an extest DFT test, array 104 may be prepared for testing as follows. The scan input mask signals 204 and CSR 604 may be initialized to flush out any don't care bits as described in connection with the intest flow. Programmable delays 212 may be programmed (e.g., individually) so that each circuit block 102 in a same group is latency matched. In one aspect, by default, each programmable delay 212 initially selects the largest possible delay to ensure that initialization of scan input mask signals 204 and CSR 604 may be performed without additional programming.

In the extest flow, extest multiplexer 216 is configured to pass a selected signal as the scan_chnl[0] signal used for the extest. SRA 210 may then be configured to operate in a particular scan response capture mode using IJTAG signals. In the case where the scan response capture mode compares test results with those of an adjacent circuit block 102, pipeline latency should be adjusted accordingly for the first circuit block 102 of the group in view of the loopback paths providing signals from the last circuit block 102 of the group. As noted, it should be appreciated that input pipeline latency should be matched among circuit blocks 102 in a same group for each of the scan response capture modes. With the scan response capture mode set, the extest may be performed. The test result of each circuit block 102 may be observed in a manner that depends on the particular scan response capture mode selected.

In the case of scan response capture mode 1, where scan test responses of adjacent circuit blocks 102 of a same group are to be compared, a switch 812 (e.g., a multiplexer) may be set to enable loopback path 808. That is, switch 812 may be set to pass the signal received via loopback path 808 onto signal 204 rather than the input received by switch 812 from the GSR 120.

FIG. 9 illustrates an example method 900 of testing IC 100 using the example DFT circuit architecture described herein. In block 902, a plurality of circuit blocks 102 are provided in the IC. In one aspect, the plurality of circuit blocks 102 are organized in an array 104. The circuit blocks 102 may be cores, for example.

Each circuit block 102 of the plurality of circuit blocks 102 includes DFT circuitry. The DFT circuitry may include a scan interface 112, wherein each scan interface 112 is uniform with the scan interface 112 of each other circuit block 102 of the plurality of circuit blocks 102. The DFT circuitry may include an EDT circuit 214 coupled to the scan interface. The EDT circuit 214 couples to circuitry under test. The DFT circuitry also may include an SRA 210 coupled to the scan interface 112. The SRA 210 is configured to operate in a selected response capture mode selected from a plurality of response capture modes.

In block 904, a GSR 120 is provided. The GSR 120 is capable of activating a subset of the plurality of circuit blocks 102 to implement parallel scan testing of the activated subset of the plurality of circuit blocks. That is, the activated circuit blocks 102 undergo a scan test in parallel (e.g., concurrently). For example, the subsets of the plurality of circuit blocks may correspond to groups such as groups 106, 108, and/or 110. GSR 120 may enable particular ones of the groups using scan control channel 114 and/or IJTAG circuitry included in GSR 120. In one example implementation, the GSR 120 is capable of selectively gating scan control signals, e.g., scan control channel 114, provided to the plurality of circuit blocks 102.

FIG. 10 illustrates another example method 1000 of testing an IC using the example DFT circuit architecture described herein. Method 1000 may be performed as part of wafer testing, e.g., during wafer sort prior to the separation of individual ICs.

In block 1002, a plurality of circuit blocks 102 are provided within the IC 100. The plurality of circuit blocks 102 is organized into a plurality of groups (e.g., groups 106, 108, 110). Each group includes two or more of the plurality of circuit blocks and fewer than all of the plurality of circuit blocks (e.g., a subset of the circuit blocks). As noted, the IC 100 may be part of a wafer of such ICs.

In block 1004, at least one selected group of the plurality of groups is activated for scan testing of the respective circuit blocks 102, wherein at least one other group of the plurality of groups is deactivated concurrently with the activating of the at least one selected group.

In block 1006, scan testing of one or more circuit blocks 102 of the selected group may be performed in parallel (e.g., concurrently). For example, only those circuit blocks 102 of the array 104 within the selected group are tested in parallel while each other circuit block is deactivated and not part of the scan testing. This allows different groups of circuit blocks 102 to be selected and tested at different times, where each circuit block 102 in a selected group, when activated, is tested in parallel.

In another aspect, only those circuit blocks that are activated within the selected group or groups may be tested in parallel. For example, while GSR 120 may activate a particular group or groups of circuit blocks 102, IJTAG signals may be used to activate and test particular circuit blocks 102 (e.g., a subset of the circuit blocks 102) within the selected group or groups, while other circuit blocks of the selected group or groups are not activated and not tested.

The foregoing and other implementations can each optionally include one or more of the following features, alone or in combination. Some example implementations include all the following features in combination.

In one aspect, the DFT circuitry of each circuit block 102 of the plurality of circuit blocks 102 includes a scan interface 112, wherein each scan interface 112 is uniform with the scan interface 112 of each other circuit block 102 of the plurality of circuit blocks 102; an EDT circuit 214 coupled to the scan interface 112, wherein the EDT circuit 214 couples to circuitry under test 804; and an SRA 210 coupled to the scan interface 112, wherein the SRA 210 is configured to operate in a selected response capture mode selected from a plurality of response capture modes.

In another aspect, the activating the selected group is performed by the GSR 120 within the IC 100. The GSR 120 may be connected to the scan interfaces 112 of the plurality of circuit blocks 102. For example, the GSR 120 may activate one or more selected groups using gate circuitry as illustrated in FIG. 3.

The method can include providing, within the GSR 120, a BSB circuit 318 configured to repurpose an output of the GSR 120 to operate as an input configured to receive a mask signal.

The method can include providing, within the SRA 210, a CSR 604 configured to generate a signature based on a scan test response of the circuit block 102.

The method can include combining, using the GSR 120, a scan output channel from a first group of the plurality of groups with a scan output channel from a second group of the plurality of groups and outputting a result of the combining. FIGS. 4A and 4B illustrate an example of the GSR 120 combining outputs of different groups of the circuit blocks 102.

The method can include selecting, for each circuit block 102 of the selected group, a selected response capture mode from a plurality of response capture modes and implementing the selected response capture mode during the scan testing.

The method can include configuring the DFT circuitry of at least one selected circuit block 102 of the group to perform a comparison of a scan test response of the circuit block 102 with a reference scan test response and generate a test status indicator that indicates a result of the comparison. In one aspect, the reference scan test response is a scan test response from an adjacent circuit block 102. In another aspect, the reference scan test response is an expected scan test response stored locally within the DFT circuitry of the selected circuit block 102. For example, the scan test response may be a signature and the reference scan test response may be an expected signature.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "real time" means a level of processing responsiveness that a user or system senses as sufficiently immediate for a particular process or determination to be made, or that enables the processor to keep up with some external process.

The terms first, second, etc. may be used herein to describe various elements. These elements should not be limited by these terms, as these terms are only used to distinguish one element from another unless stated otherwise or the context clearly indicates otherwise.

The flowchart and block diagrams in the Figures illustrate the architecture, functionality, and operation of possible implementations of systems and methods according to various aspects of the inventive arrangements. In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

An IC can include a plurality of circuit blocks, wherein each circuit block of the plurality of circuit blocks includes DFT circuitry. The DFT circuitry can include a scan interface, wherein each scan interface is uniform with the scan interface of each other circuit block of the plurality of circuit blocks. The DFT circuitry can include an EDT circuit coupled to the scan interface, wherein the EDT circuit couples to circuitry under test. The DFT circuitry also can include an SRA coupled to the scan interface, wherein the SRA is configured to operate in a selected response capture mode selected from a plurality of response capture modes. The IC also can include a GSR connected to the scan interfaces of the plurality of circuit blocks, wherein the GSR is configured to activate a subset of the plurality of circuit blocks to implement parallel scan testing of the activated subset of the plurality of circuit blocks.

The foregoing and other implementations can each optionally include one or more of the following features, alone or in combination. Some example implementations include all the following features in combination.

In one aspect, the GSR is configured to receive scan test responses from the plurality of circuit blocks and output the scan test responses from the integrated circuit.

In another aspect, the GSR is configured to activate the subset of the plurality of circuit blocks by selectively gating scan control signals provided to the plurality of circuit blocks.

In another aspect, at least one of the plurality of scan response capture modes outputs a scan test response from the circuit block to the GSR. In another aspect, at least another one of the plurality of scan response capture modes generates a test status indicator stored in the circuit block, wherein the test status indicator indicates whether the circuit block passed the scan test based on a comparison of the scan test response from the circuit block with a reference scan test response. The comparison is performed within the circuit block. The reference scan test response may be a scan test response from an adjacent circuit block or an expected scan test response stored in a register within the SRA. For example, the scan test response may be a signature and the expected scan test response may be an expected signature.

In another aspect, the GSR includes a BSB circuit configured to repurpose an output of the GSR to operate as an input configured to receive a mask signal.

In another aspect, the GSR may include a CSR configured to generate a signature based on a scan test response of the circuit block based on the selected scan response capture mode. The CSR may be configured to operate as a shift register based on the selected scan response capture mode.

In another aspect, the plurality of circuit blocks is subdivided into a plurality of groups where each group includes a subset of the plurality of circuit blocks. The GSR is configured to combine a scan output channel from a first group of the plurality of groups with a scan output channel from a second group of the plurality of groups and output a result of the combining.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. An integrated circuit, comprising:
a plurality of circuit blocks organized in an array as a grid having a plurality of columns, wherein each circuit block of the plurality of circuit blocks is similar and includes design for testability circuitry including a scan interface, an embedded deterministic test circuit, and a scan response analyzer;
wherein the scan interface in each circuit block of the plurality of circuit blocks is uniform;
wherein in each circuit block the embedded deterministic test circuit is coupled to the scan interface and couples to circuitry under test in the circuit block;
wherein the scan response analyzer in each circuit block is coupled to the scan interface and the embedded deterministic test circuit, and wherein the scan response analyzer in each circuit block is configured to operate in a selected scan response capture mode selected from a plurality of scan response capture modes;
wherein the scan response analyzers in same columns of the array are serially connected to each other; and
a global scan router connected to the scan interfaces of the plurality of circuit blocks, wherein the global scan router is configured to activate a selected column of the plurality of circuit blocks to implement parallel scan testing of each circuit block of the selected column; and wherein in at least one of the plurality of scan response capture modes, each scan response analyzer of the selected column is configured to generate a first scan test response, receive a second scan test response from a scan response analyzer of an adjacent circuit block of the selected column via the serial connection, and compare the first scan test response with the second scan test response.

2. The integrated circuit of claim 1, wherein the global scan router is configured to receive scan test responses from the plurality of circuit blocks and output the scan test responses from the integrated circuit.

3. The integrated circuit of claim 1, wherein the global scan router is configured to activate different ones of the columns of the array by selectively gating scan control signals provided to the plurality of circuit blocks.

4. The integrated circuit of claim 1, wherein a result of comparing the first scan test response with the second scan test response is stored in a memory element of the respective scan response analyzers.

5. The integrated circuit of claim 1, wherein another one of the plurality of scan response capture modes configures the scan response analyzer of each circuit block of the selected column to pass through a received input.

6. The integrated circuit of claim 1, wherein another one of the plurality of scan response capture modes configures the scan response analyzers of the selected column to concatenate contents of configurable shift registers within the respective scan response analyzers of the selected column and output the concatenated contents on a single output channel to the global scan router.

7. The integrated circuit of claim 1, wherein the global scan router includes:
a bidirectional scan bus circuit configured to repurpose an output of the global scan router to operate as an input configured to receive a mask signal.

8. The integrated circuit of claim 1, wherein the scan response analyzer of each circuit block comprises:
a configurable shift register configured to operate as a linear feedback shift register to generate a signature based on the scan test response of the circuit block or operate as a shift register based on the selected scan response capture mode.

9. The integrated circuit of claim 1, wherein in at least one of the plurality of scan response capture modes, the scan response analyzer of each circuit block in the selected column is configured to compare the first scan test response with a reference scan test response and generate a test status indicator that indicates whether the circuit block passed a scan test based on the comparison.

10. The integrated circuit of claim 1, wherein
the global scan router is configured to combine a scan output channel from a first column with a scan output channel from a second column and output a result of the combining.

11. A method of testing an integrated circuit, the method comprising:
providing a plurality of circuit blocks within the integrated circuit, wherein the plurality of circuit blocks are organized in an array as a grid having a plurality of columns, wherein each circuit block of the plurality of circuit blocks is similar and includes design for testability circuitry including a scan interface, an embedded deterministic test circuit, and a scan response analyzer;
wherein the scan response analyzers in same columns of the array are serially connected to each other;
activating each circuit block of a selected column, wherein at least one other column of the plurality of columns is deactivated concurrently with the activating of the selected column;
performing scan testing of each circuit block of the selected column in parallel; and
implementing a scan response capture mode for the scan testing in which each scan response analyzer of the selected column generates a first scan test response, receives a second scan test response from a scan response analyzer of an adjacent circuit block of the selected column via the serial connection, and compares the first scan test response with the second scan test response.

12. The method of claim 11, wherein:
the scan interface in each circuit block of the plurality of circuit blocks is uniform;
in each circuit block the embedded deterministic test circuit is coupled to the scan interface and couples to circuitry under test in the circuit block; and
the scan response analyzer in each circuit block is coupled to the scan interface and the embedded deterministic test circuit, and wherein the scan response analyzer in each circuit block is configured to operate in a selected scan response capture mode selected from a plurality of scan response capture modes.

13. The method of claim 11, wherein the activating each circuit block of the selected column is performed by a global scan router within the integrated circuit, and wherein the global scan router is connected to the scan interfaces of the plurality of circuit blocks.

14. The method of claim 13, comprising:
providing, within the global scan router, a bidirectional scan bus circuit configured to repurpose an output of the global scan router to operate as an input configured to receive a mask signal.

15. The method of claim 13, comprising:
providing, within the scan response analyzer, a configurable shift register configured to operate as a linear feedback shift register to generate a signature based on a scan test response of the circuit block or operate as a shift register based on the selected scan response capture mode of the circuit block.

16. The method of claim 13, comprising:
combining, using the global scan router, a scan output channel from a first column of the plurality of columns with a scan output channel from a second column of the plurality of columns and outputting a result of the combining.

17. The method of claim 11, further comprising:
implementing a further scan response capture mode in which each scan response analyzer of the selected column performs a comparison of a scan test response generated by the scan response analyzer with a reference scan test response and generates a test status indicator that indicates whether the circuit block passed a scan test based on the comparison.

18. The method of claim 11, further comprising:
implementing a further scan response capture mode in which contents of a configurable shift register disposed in each scan response analyzer of the selected column are concatenated via the serial connections and the concatenated results are output from the selected column.

19. An integrated circuit, comprising:
a plurality of circuit blocks organized in an array as a grid having a plurality of columns, wherein each circuit block of the plurality of circuit blocks is similar and includes design for testability circuitry including a scan interface, an embedded deterministic test circuit, and a scan response analyzer;

wherein the scan interface in each circuit block of the plurality of circuit blocks is uniform;

wherein each circuit block of the embedded deterministic test circuit is coupled to the scan interface and couples to circuitry under test in the circuit block;

wherein the scan response analyzer in each circuit block is coupled to the scan interface and the embedded deterministic test circuit, and wherein the scan response analyzer in each circuit block is configured to operate in a selected scan response capture mode selected from a plurality of scan response capture modes, wherein one or more of the plurality of scan response capture modes implement comparison operations;

wherein the scan response analyzers in same columns of the array are serially connected to each other and configurable to communicate scan test results generated with the respective scan response analyzers from the comparison operations to one another over the serial connections; and a global scan router connected to the scan interfaces of the plurality of circuit blocks, wherein the global scan router is configured to activate a selected column of the plurality of circuit blocks to implement parallel scan testing of each circuit block of the selected column of the plurality of circuit blocks.

* * * * *